United States Patent [19]

Campisi et al.

[11] Patent Number: 4,627,157

[45] Date of Patent: Dec. 9, 1986

[54] INSERTION VERIFICATION AND CRIMPING OF LEADS

[75] Inventors: Carl Campisi, Chicago; Abraham Lev; Richard G. Schmid, both of Glenview, all of Ill.

[73] Assignee: Zenith Electronics Corporation, Glenview, Ill.

[21] Appl. No.: 828,584

[22] Filed: Feb. 10, 1986

Related U.S. Application Data

[63] Continuation of Ser. No. 614,349, May 25, 1984, abandoned.

[51] Int. Cl.$^4$ ............................................. B23P 19/00
[52] U.S. Cl. ...................................... 29/741; 29/593; 29/838
[58] Field of Search ................. 29/741, 739, 705, 593, 29/837, 838, 839, 566, 566.1, 566.3; 340/660

[56] References Cited

U.S. PATENT DOCUMENTS

| | | | |
|---|---|---|---|
| 3,429,170 | 2/1969 | Romeo | 29/741 |
| 3,732,898 | 5/1973 | Boyer | 29/741 |
| 4,218,817 | 8/1980 | Takano | 29/741 |
| 4,292,727 | 10/1981 | Maxner | 29/566.3 |
| 4,367,583 | 1/1983 | Baccei | 29/739 |
| 4,485,548 | 12/1984 | Janisiewicz | 29/593 |
| 4,510,686 | 4/1985 | Foster | 29/838 |
| 4,557,043 | 12/1985 | Starski | 29/741 |

Primary Examiner—Howard N. Goldberg
Assistant Examiner—P. W. Echols

[57] ABSTRACT

A crimping block is positioned immediately adjacent to one side of a circuit board having predrilled apertures therein through which the electrical leads of a circuit component are inserted. The crimping block includes a plurality of linearly displaceable crimping pins, each having an upper, beveled end adapted to receive, deflect and crimp an associated component lead inserted through an immediately adjacent circuit board aperture. Upon contact with an inserted component lead, the crimping pin is displaced downward a predetermined distance. During downward displacement of the crimping pin the electrical lead is deflected laterally followed by the upward deflection of the electrical lead upon the end of crimping pin travel. Upon the end of crimping pin travel, its beveled, upper end crimps the electrical lead in tight fitting relation with a circuit board-mounted conductor. Each crimping pin forms a conductive element in a sensor circuit which is completed upon positioning of an electronic component on the circuit board and insertion of its leads through the apertures therein in providing component insertion verification and operational testing.

7 Claims, 4 Drawing Figures

INSERTION VERIFICATION AND CRIMPING OF LEADS

This application is a continuation of application Ser. No. 614,349, filed May 25, 1984, now abandoned.

BACKGROUND OF THE INVENTION

This invention relates generally to electronic component circuit board mounting and is particularly directed to the automatic connection, detection and testing of an electronic component installed on a circuit board.

Electronic circuits are typically comprised of many components linked by means of linear conductors arranged on a board-like structure. The flat, board-like element upon which the circuit is fabricated is typically referred to as "the substrate", or circuit board, and is used primarily for mechanical support and insulating purposes, such as with ceramic, plastic, and glass substrates, but semiconductor and ferrite substrates may also provide useful electrical functions. The conductive elements coupling circuit components are typically in the form of elongated metal foils which may be positioned on one or on both sides of the circuit board. Circuit components are frequently positioned on a first side of the circuit board, with their associated electrical leads extending through predrilled apertures in the board so as to contact conductive foils on a second side of the board in completing the circuit.

Initially, the procedure of inserting the various components on the circuit board was performed manually. Because of the small size of the components in general and the slots in the circuit board in particular, this procedure was tedious, time consuming, and inefficient. In addition, good electrical contact was frequently not established between component leads and circuit board conductors due to bent electrical leads or misalignment of the leads with respect to the conductors on the other side of the circuit board. Frequently, electrical circuit integrity problems were not detected until the circuit board left the assembly line requiring the entire circuit board assembly to be either discarded or repaired prior to installation in the end product. Such problems brought about automated procedures for circuit board mounting, which procedures, while somewhat more efficient, still suffered from many of the same problems.

The present invention is intended to overcome the limitations of the prior art and to avoid the aforementioned problems by providing an arrangement for automatically detecting, connecting and testing an electronic component inserted on a circuit board. A crimping block is positioned immediately adjacent component mounting slots in a circuit board for receiving, deflecting and crimping component leads inserted through the aforementioned slots. The present invention is particularly adapted for use in the automatic assembly and testing of circuit boards and associated circuitry.

OBJECTS OF THE INVENTION

Accordingly, it is an object of the present invention to provide for automatically mounting and connecting an electronic component on a circuit board.

It is another object of the present invention to provide for the automatic detection of the connecting of an electronic component in a circuit and for the testing of the component.

Yet another object of the present invention is to provide an improved arrangement for automatically inserting a circuit element on a circuit board.

A further object of the present invention is to provide for the automatic assembly and testing of a circuit board.

A still further object of the present invention is to provide a more reliable, faster, and more accurate arrangement for the assembly of a circuit board.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

DESCRIPTION OF THE PREFERRED EMBODIMENT

Figure 1:
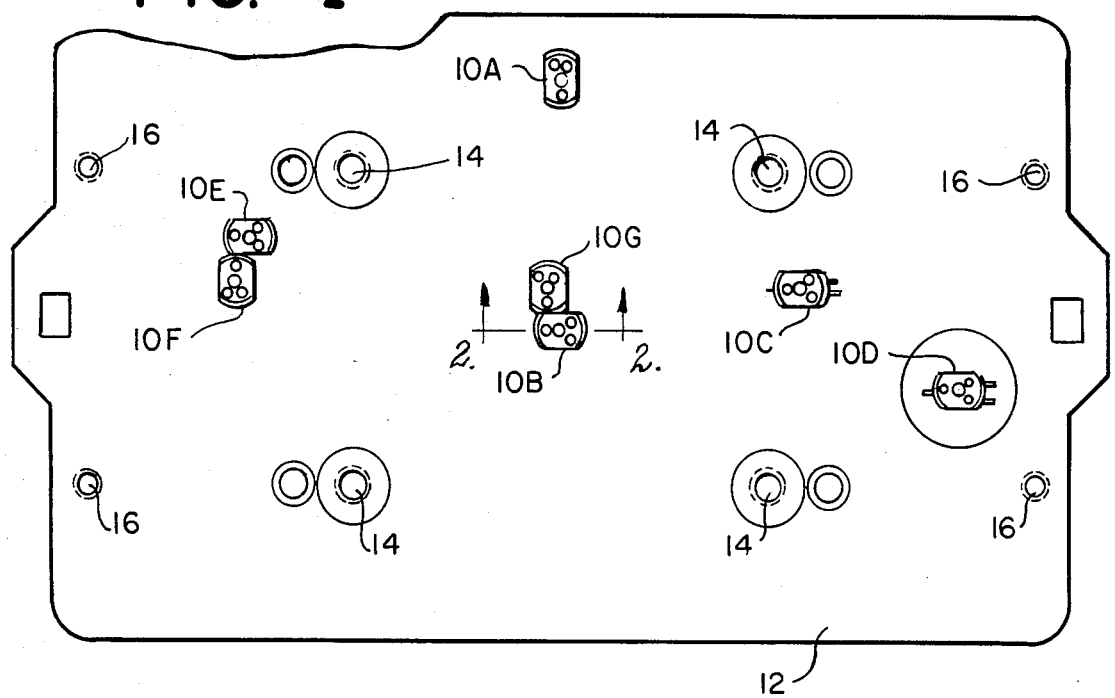
FIG. 1 is a top plan view of a support panel in which are positioned insertion verification/lead crimping units used in the assembly of a circuit board in accordance with the present invention.

Referring to FIG. 1, there is shown a top plan view of a support panel 12 in which are positioned a plurality of insertion verification/lead crimping units in accordance with the present invention. The insertion verification/lead crimping units are generally designated as elements 10A through 10G. The support panel 12 is coupled on the bottom portion thereof by means of a plurality of mounting screws 14 to either a stationary assembly or to a displacement assembly (not shown). Where stationary assembly is used, means are provided for proper positioning of the circuit board above the support panel 12. Means for displacing the circuit board may also be used in combination with the aforementioned support panel displacement means for proper relative positioning of the circuit board and the support panel 12. The present invention will operate equally well with either of the aforementioned arrangements. Where the support panel 12 is displaced, the displacement assembly is capable of positioning the support panel 12 so as to be immediately beneath a circuit board (also not shown in FIG. 1) upon which various electronic components are to be positioned in circuit. Once the support panel 12 is properly positioned relative to an overlying circuit board, each of the insertion verification/lead crimping units is positioned immediately beneath a predrilled aperture, or apertures, in the circuit board for receiving electrical leads, through the aforementioned apertures, of various electronic components inserted on the upper surface of the circuit board. The displacement means may be any conventional electro-mechanical assembly for proper positioning of the support panel 12. Since the displacement means does not form a part of the present invention and additional details thereof need not be explained for an understanding of the present invention, it will not be further considered herein.

Positioned adjacent respective ends of the support panel 12 are a pair of alignment posts, or standards, 16. The alignment posts 16 are used in conjunction with a circuit board positioned immediately above the support panel 12 in order to ensure proper alignment therebetween. The alignment posts 16 are typically inserted within corresponding apertures in the circuit board to ensure proper location of each of the insertion verification/lead crimping units 10A through 10G positioned within the support panel 12 relative to the circuit board. With the four alignment posts 16 positioned within corresponding alignment apertures in the circuit board, proper alignment of the insertion verification/lead crimping units with respect to component mounting slots in the circuit board is ensured. In one arrangement, the circuit boards are linearly displaced above the support panel 12. Once proper alignment between the support panel 12 and a circuit board is established by means of the alignment posts 16, the support panel 12 is then displaced vertically toward the circuit board to permit each of the insertion verification/lead crimping units to engage the leads of a respective electronic component positioned upon the circuit board as described below. However, the present invention is not limited to such an arrangement and would operate equally well if the circuit board with components thereon were displaced downward toward the support panel 12. Similarly, the support panel 12 could be sequentially and linearly displaced along an aligned arrangement of circuit boards in providing proper alignment therebetween. In a preferred embodiment, the support panel 12 is comprised of Lexan while the housing of each of the insertion verification/lead crimping units is comprised of plexiglas.

Figure 2:
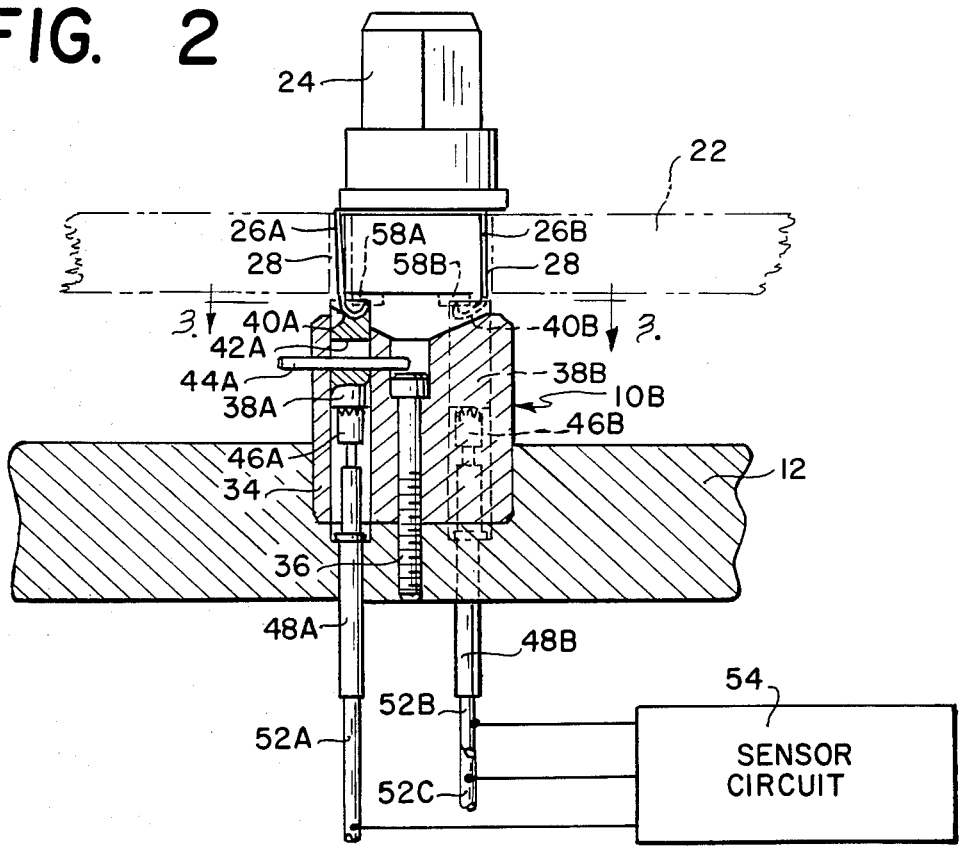
FIG. 2 is a sectional view of an insertion verification/lead crimping unit as shown in FIG. 1 taken along sight line 2—2 therein.
Figure 4:
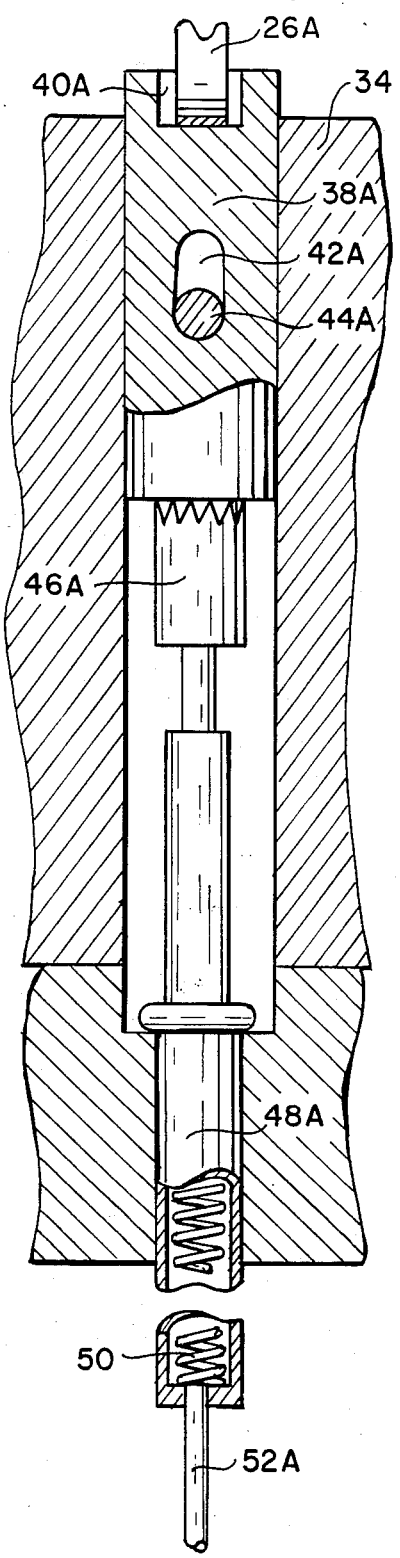
FIG. 4 is a sectional view of a portion of an insertion verification/lead crimping unit as shown in FIG. 3 taken along sight line 4—4 therein.
Figure 3:
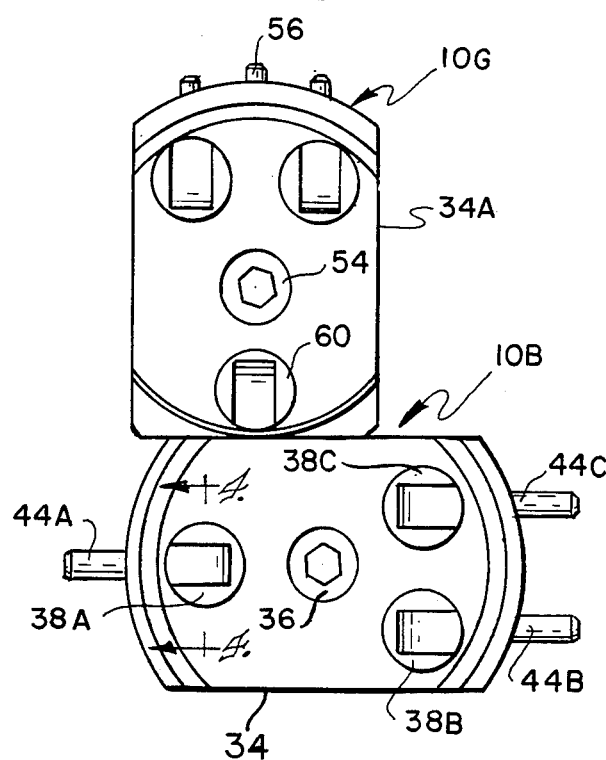
FIG. 3 is a sectional view of a pair of insertion verification/lead crimping units as shown in FIG. 1 taken along sight line 3—3 FIG. 2.

Referring to FIGS. 2, 3 and 4 there are shown various views of an insertion verification/lead crimping unit in accordance with the present invention. Also shown in FIG. 2 is the position of a circuit board, or substrate, 22 relative to an insertion verification/lead crimping unit 10B and a support panel 12. The circuit board 22 includes a plurality of predrilled apertures 28 extending therethrough, through which the various conducting leads 26A, 26B of an electronic component 24 are inserted. As shown in the various figures herein, a 3-lead electrical component is described for use with the present invention. However, an insertion verification/lead crimping unit in accordance with the present invention is capable of operating with any number of leads extending from an electronic component and through mounting apertures within a circuit board. In the detailed description of the insertion verification/lead crimping unit of the present invention, since it is shown as adapted to operate with three component leads, corresponding elements of the insertion verification/lead crimping unit are assigned the same number with letters A, B and C used to distinguish the three similar components as well as the three electrical leads of the circuit component 24.

The insertion verification/lead crimping unit 10B includes a crimping block, or housing, 34 positioned within a recessed portion on the upper surface of the support panel 12. The crimping block 34 includes an upper recessed portion through which a plurality of elongated slots, or channels, extend downward through the length of the crimping block. Positioned within a center elongated channel in the crimping block 34 is a mounting screw 36 which includes a threaded end portion for engaging the support panel 12 in providing for the secure mounting of the crimping block 34 thereon. In a preferred embodiment, the center mounting screw 36 is a socket head cap screw.

Additional channels are provided within crimping block 34 which also extend downward through the length thereof. Positioned within each of the remaining elongated channels is the combination of a crimping pin, shown as elements 38A and 38B for two of the channels in the crimping block, and a probe, shown as elements 46A and 46B for the same two channels of the crimping block 34 of FIG. 2. A third channel containing the combination of a crimping pin 38C and an associated probe is included in the crimping block 34 of the insertion verification/lead crimping unit 10B as shown in the sectional view of FIG. 3.

An upper portion of each of the crimping pins 38A, 38B is provided with a beveled upper end 40A, 40B, respectively. When the crimping block 34 is properly positioned relative to the circuit board 22, the crimping block channels and crimping pins positioned therein are located directly beneath and immediately adjacent corresponding apertures 28 within the circuit board 22. Positioning of the circuit component 24 upon the circuit board 22 such that its leads 26A, 26B extend through the apertures 28 in the circuit board 22, causes the ends of the respectives leads of the circuit component to engage respective crimping pins 40A, 40B positioned within the crimping block 34. Downward displacement of the circuit component 24 results in a corresponding downward displacement of the combination of crimping pins 38A, 38B and associated probes 46A, 46B.

As shown in FIGS. 2 and 4 for the case of crimping pin 38A, each crimping pin is provided with a displacement slot 42A therein. Positioned within the displacement slot 42A and inserted within aligned apertures in the crimping block 34 so as to be aligned generally perpendicular to the longitudinal axis of crimping pin 38A is a holding pin 44A. Holding pin 44A limits the vertical travel of crimping pin 38A by engaging upper and lower inner portions of the crimping pin 38A which define displacement slot 42A.

As shown in FIGS. 2 and 4, an upper portion of the probe 46A abuts a lower portion of the crimping pin 38A. A lower end portion of the probe 46A contacts the lower end of the channel within which the crimping pin/probe combination is positioned. A receptacle 48A is coupled to the lower end portion of probe 46A. The receptacle 48A is in the form of an elongated, tubular member within which is positioned a coiled spring 50 along the length thereof as shown in the partially cut away portion of FIG. 4. Spring 50 biases the combination of crimping pin 38A and probe 46A upward toward circuit board 22. Without the electrical lead 26A of a circuit component 24 in contact with the beveled upper end 40A of the crimping pin 38A, the crimping pin 38A is positioned within the channel of crimping block 34 such that its lower, inner surface defining a portion of the displacement slot 42A therein abuts the holding pin 44A as shown in FIGS. 2 and 4. This arrangement limits further upward displacement of the combination of crimping pin 38A and probe 46A.

As previously described, insertion of lead 26A within circuit board aperture 28 when electronic component 24 is positioned upon circuit board 22 causes the distal end portion of lead 26A to engage the beveled upper end 40A of crimping pin 38A. This results in the downward displacement of the combination of crimping pin 38A and probe 46A until the upper, inner portion of the crimping pin 38A defining a portion of displacement slot 42A contacts holding pin 44A. Further downward displacement of the crimping pin 38A is prevented by its engagement with the holding pin 44A. During the downward displacement of the crimping pin 38A, the distal end of electrical lead 26A is deflected inward by means of the beveled upper end 40A of the crimping pin. Further downward displacement of electronic component 24 will eventually cause holding pin 44A to oppose and stop further downward displacement of crimping pin 38A. With crimping pin 38A no longer displaced downward, further downward displacement of the electronic component 24 will cause the distal end of its electrical lead 26A to be bent upward by the action of the beveled upper end 40A of the crimping pin. This is shown in FIG. 2 wherein is illustrated the manner in which the electrical leads 26A and 26B are crimped over and in contact with foil conductors 58A and 58B, respectively, by means of the insertion verification/lead crimping unit 10B of the present invention. While the crimping operation described above has been primarily concerned with electrical lead 26A and crimping pin 38A, a similar description is equally applicable to the interaction of the other two crimping pins and electrical leads associated therewith.

In a preferred embodiment, each of the crimping pins, probes and receptacles is comprised of a conductive metal such as brass. The metal used must be hard enough to withstand the impact force between the circuit component electrical leads and the crimping block and components thereof. Electrical leads 52A and 52B are respectively coupled to the lower end portions of receptacles 48A and 48B, while electrical lead 52C is coupled to the lower end portion of a third receptacle which is not shown in the figures. Coupled to each of the electrical leads 52A, 52B and 52C is a sensor circuit 54 which provides a DC voltage on one of the aforementioned wire leads leading to the insertion verification/lead crimping unit 10B. When the respective electrical leads of circuit component 24 are in contact with corresponding crimping pins within crimping block 34, a return signal may be detected on the other two return lines which do not carry the DC output voltage from sensor circuit 54. Electronic component 24 thus acts as a conductor in completing the circuit comprised of the various crimping pin, probe, receptacle and wire lead combinations coupled to the sensor circuit 54. It is in this manner that proper positioning of an electronic component 24 upon circuit board 22 and the crimping of the leads thereof may be automatically detected by means of a sensor circuit 54. Sensor circuit 54 may be conventional in design and operation and the specifics thereof do not form a part of the present invention and thus are not further discussed herein.

In a preferred embodiment, sensor circuit 54 provides a 5 VDC output voltage via one of the aforementioned electrical leads and senses a return voltage on each of the other electrical leads coupled thereto. A predetermined return voltage value may be expected depending upon the sensor circuit output voltage and the electronic component positioned upon circuit board 22. The sensor circuit 54 may be calibrated to provide operating criteria for the acceptance or rejection of the electronic component 24 coupled to the circuit board 22 by means of the insertion verification/lead crimping unit of the present invention. In the present example, an adjustable electronic component such as a trimmer resistor is shown positioned upon and coupled to circuit board 22 and which is capable of providing two return signals to the sensor circuit 54. Thus, sensor circuit 54 is capable of determining whether the electronic component 24 has been adjusted to the proper setting during installation of the component upon circuit board 22 in providing increased reliability and speed in the automatic assembly of the circuit board.

Referring specifically to FIGS. 3 and 4, it can be seen that the beveled upper end of each of the crimping pins includes a concave slot therein for engaging, guiding and bending an electrical lead positioned in abutting contact therewith. The angle at which the upper end of each of the crimping pins is beveled is determined primarily by the extent of crimping sought to be imparted to the component electrical leads which depends primarily upon circuit board density. For example, if the lower surface of circuit board 22 contains many closely spaced foil conductors thereon, it would be desirable to increase the bevel angle of the upper end of the crimping pin in order to impart a sharper, more acute bend in the distal end of a component electrical lead. On the other hand, if the foil conductors on the lower surface of circuit board 22 are not closely packed, it may be desirable to provide a flatter, less abrupt crimp in each of the component electrical leads.

FIG. 3 shows two arrangements for the insertion of holding pins within closely spaced insertion verification/lead crimping units 10B and 10G. For the case of insertion verification/lead crimping unit 10B, holding pins 44A, 44B and 44C are inserted in crimping block 34 adjacent a corresponding crimping pin. However, due to the close spacing of the insertion verification/lead crimping units 10B and 10G, one of the holding pins 56 must be inserted within the crimping block 34A of the insertion verification/lead crimping unit 10G from a side opposite that to which crimping pin 60 is adjacent. In this case, a slot extends substantially the entire width of crimping block 34A such that holding pin 56 extends through the center, vertically oriented slot within which mounting screw 54 is positioned. It is in this manner that a crimping pin 60 positioned immediately adjacent a surface of crimping block 34A which abuts a second crimping block 34 is securely maintained in position within the insertion verification/lead crimping unit 10G.

There has thus been disclosed an insertion verification arrangement for use in positioning an electronic component on a circuit board which is also capable of coupling the component in circuit by crimping its leads to circuit board conductors. In addition to detecting component insertion on the circuit board and automatically connecting it to circuitry thereon, the insertion verification/lead crimping unit of the present invention is also capable of testing the electronic component thus installed on the circuit board.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. In the mounting of an electronic component having a plurality of leads on a first side of a circuit board and in circuit with conductors positioned on a second side of said circuit board, said circuit board having a plurality of apertures therein through each of which a respective lead is inserted, apparatus for detecting the insertion of said leads through said apertures, for coupling each of said leads to a respective conductor, and for testing the electronic component following the mounting of the electronic component on said circuit board, said apparatus comprising:

support means;

a housing mounted to said support means and maintained in position adjacent the apertures in said circuit board on the second side thereof, said housing including a plurality of channels extending therethrough and aligned with a respective circuit board aperture;

a plurality of conductive crimping means, wherein each of said crimping means includes an elongated member linearly displaceable along and within a respective channel of said housing between a first proximal and a second distal end stop position relative to said circuit board and wherein each elongated member has a beveled distal end portion for engaging a respective component lead and positioning said lead in electrical contact with a conductor on the second side of said dircuit board;

displacement stop means coupled to each of said elongated members for limiting the displacement thereof between said first proximal and said second distal end stop positions, wherein a distal end of a component lead is deflected laterally when a respective elongated member engaging said component lead is displaced toward said second distal end stop position, with said component lead then deflected toward said circuit board when said elongated member reaches said second distal end stop position so as to be positioned in electrical contact with a circuit board conductor; and detector means coupled in circuit to each of said crimping means for detecting the engagement of each of said crimping means with a respective component lead, whereupon the electronic component is in circuit with said detector means for testing the operation of the electronic component following the mounting of the electronic component on the circuit board.

2. The apparatus of claim 1 wherein said support means is comprised of a generally flat panel having a recessed portion within which said housing is positioned.

3. The apparatus of claim 2 wherein said generally flat panel is comprised of a hard plastic.

4. The apparatus of claim 1 further comprising biasing means coupled to said crimping means for urging said elongated members to said first proximal end stop position.

5. The apparatus of claim 4 wherein said biasing means comprises a plurality of coiled springs and wherein each of said coiled springs urges a respective elongated member to said first proximal end stop position.

6. The apparatus of claim 1 wherein said detector means comprises a voltage source coupled to one of said crimping means in combination with a voltage detector coupled to the remaining crimping means.

7. The apparatus of claim 1 wherein said housing is comprised of a hard plastic.

* * * * *